(12) United States Patent
Besser et al.

(10) Patent No.: US 9,142,633 B2
(45) Date of Patent: Sep. 22, 2015

(54) INTEGRATED CIRCUITS AND METHODS FOR FABRICATING INTEGRATED CIRCUITS WITH SILICIDE CONTACTS ON NON-PLANAR STRUCTURES

(71) Applicant: GLOBALFOUNDRIES Inc., Grand Cayman (KY)

(72) Inventors: Paul R. Besser, Sunnyvale, CA (US); Mark V. Raymond, Schenectady, NY (US); Valli Arunachalam, Pleasant Valley, NY (US); Hoon Kim, Guilderland, NY (US)

(73) Assignee: GLOBALFOUNDRIES, INC., Grand Cayman (KY)

(*) Notice: Subject to any disclaimer, the term of this patent is extended or adjusted under 35 U.S.C. 154(b) by 75 days.

(21) Appl. No.: 13/714,049

(22) Filed: Dec. 13, 2012

(65) Prior Publication Data

US 2014/0167264 A1 Jun. 19, 2014

(51) Int. Cl.
*H01L 21/283* (2006.01)
*H01L 29/49* (2006.01)
*H01L 21/285* (2006.01)
*H01L 29/417* (2006.01)
*H01L 29/66* (2006.01)
*H01L 29/78* (2006.01)

(52) U.S. Cl.
CPC ...... *H01L 29/4916* (2013.01); *H01L 21/28518* (2013.01); *H01L 29/41791* (2013.01); *H01L 29/66795* (2013.01); *H01L 29/785* (2013.01)

(58) Field of Classification Search
CPC ....................................................... H01L 29/665
USPC ................................................... 257/E21.438
See application file for complete search history.

(56) References Cited

U.S. PATENT DOCUMENTS

| | | | | |
|---|---|---|---|---|
| 7,151,018 B1* | 12/2006 | Nunan et al. | ................... | 438/176 |
| 2005/0156208 A1* | 7/2005 | Lin et al. | ........................ | 257/288 |
| 2005/0258477 A1* | 11/2005 | Saito | ............................ | 257/327 |
| 2008/0111163 A1* | 5/2008 | Russ et al. | ..................... | 257/280 |
| 2008/0171408 A1* | 7/2008 | Zhu et al. | ....................... | 438/157 |
| 2009/0065870 A1* | 3/2009 | Li et al. | ........................... | 257/368 |
| 2009/0250757 A1* | 10/2009 | Takahashi | ...................... | 257/348 |
| 2010/0163937 A1* | 7/2010 | Clendenning et al. | ........ | 257/288 |
| 2010/0276761 A1* | 11/2010 | Tung et al. | ..................... | 257/384 |
| 2011/0001169 A1* | 1/2011 | Ozcan et al. | .................. | 257/213 |
| 2011/0095378 A1* | 4/2011 | Lee et al. | ....................... | 257/401 |

* cited by examiner

*Primary Examiner* — Michael Lebentritt
*Assistant Examiner* — Jordan Klein
(74) *Attorney, Agent, or Firm* — Ingrassia Fisher & Lorenz, P.C.

(57) ABSTRACT

Integrated circuits and methods for fabricating integrated circuits are provided. In an embodiment, a method for fabricating an integrated circuit includes providing a semiconductor substrate and forming fins over the semiconductor substrate. Each fin is formed with sidewalls. The method further includes conformally depositing a metal film stack on the sidewalls of each fin. In the method, the metal film stack is annealed to form a metal silicide film over the sidewalls of each fin.

17 Claims, 5 Drawing Sheets

INTEGRATED CIRCUITS AND METHODS FOR FABRICATING INTEGRATED CIRCUITS WITH SILICIDE CONTACTS ON NON-PLANAR STRUCTURES

TECHNICAL FIELD

The present disclosure generally relates to integrated circuits and methods for fabricating integrated circuits, and more particularly relates to integrated circuits and methods for fabricating integrated circuits that provide silicide contacts on non-planar structures.

BACKGROUND

Non-planar structures such as finFETs are being implemented in integrated circuit fabrication at the fourteen nanometer technology node. One important challenge with the implementation of non-planar structures is the formation of contacts to the non-planar (fin) source/drain regions. There are two approaches for contact formation: formation of contacts to merged fins and formation of contacts to unmerged fins.

For merged fins, a layer of epitaxial silicon is grown on fins. As a result of the epitaxial growth, adjacent fins become merged. The resulting contact area is large and lacks topographical variation. Therefore, conventional silicide processes can be used to successfully form silicide contacts to the top surface of the merged fins. Conventional silicide processes include the formation of an intermetallic silicide material on the active silicon. Current fabrication processes typically use nickel-platinum silicide (NiPtSi), nickel silicide (NiSi) or titanium silicide (TiSi) as the silicide material.

Unmerged fins are required, for example, for Static Random Access Memory (SRAM) devices. Unmerged fins permit the design of SRAM cells with tighter pitch, taking less area of the Si for the SRAM and making the overall chip layout smaller. Typically, SRAM cells are large in today's integrated circuits. It is well known that interface resistivity (Rs) is a significant factor in the overall contact resistance of an integrated circuit. A plurality of unmerged fins provides a large number of small contacts, each of which adds resistance. The total of the resistance from the contacts can be significantly larger than that of a merged set of fins, which has a large contact area and lower resistance. Lowering the contact resistance of the many small unmerged fins can make a significant difference in circuit performance. However, contacting unmerged fins let alone in a manner with low contact resistance is particularly challenging. For example, for finFETs at the ten nanometer technology node, the fins are extremely narrow and the use of silicidation to form contacts risks the complete consumption of the fin by the silicide reaction.

Accordingly, it is desirable to provide integrated circuits and methods for fabricating integrated circuits with silicide contacts on unmerged non-planar transistors. In addition, it is desirable to provide integrated circuits and methods for fabricating integrated circuits which provide for contact formation on sidewalls of non-planar structures. Also, it is desirable to provide integrated circuits and methods for fabricating integrated circuits which consumes a low amount of silicon of a non-planar structure to avoid complete consumption of the non-planar structure during contact formation through silicidation. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with one embodiment, a method for fabricating an integrated circuit includes providing a semiconductor substrate and forming fins over the semiconductor substrate. Each fin is formed with sidewalls, and the method further includes conformally depositing a metal film stack on the sidewalls of each fin. In the method, the metal film stack is annealed to form a metal silicide film over the sidewalls of each fin.

In another embodiment, a method for fabricating an integrated circuit includes providing a semiconductor substrate and forming a non-planar transistor structure over the semiconductor substrate. The non-planar structure has sidewalls, and the method provides for depositing a metal silicide material over the sidewalls of the non-planar structure by atomic layer deposition (ALD). In the method, the metal silicide material is annealed to form a metal silicide film over the sidewalls of the non-planar structure.

In accordance with another embodiment, an integrated circuit includes a semiconductor substrate and fins formed on the semiconductor substrate. Each fin has sidewalls, and the integrated circuit also includes a metal silicide film conformally formed on the sidewalls of each fin. Further, a gap is defined between adjacent fins.

BRIEF DESCRIPTION OF THE DRAWINGS

Embodiments of methods for fabricating integrated circuits with silicide contacts on non-planar transistors will hereinafter be described in conjunction with the following drawing figures, wherein like numerals denote like elements, and wherein.

DETAILED DESCRIPTION

The following detailed description is merely exemplary in nature and is not intended to limit integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits and methods for fabricating integrated circuits with silicide contacts on non-planar structures are provided. Problems faced by conventional processes when forming contacts on non-planar structures may be avoided. In order to avoid consuming the fin, the silicide must be extremely thin. Further, in order to provide sufficient contact area, the silicide must form along the sidewalls of the non-planar fins. It is contemplated herein that metal silicide material be conformally deposited on the sidewalls of non-planar structures in order to form contacts to non-planar structures. Also, silicon may be deposited over the sidewalls of the non-planar structures to prevent complete consumption of the non-planar structures during silicidation.

FIGS. 1-15 illustrate steps in accordance with various embodiments of methods for fabricating integrated circuits. While FIGS. 1-9 illustrate fin structures having a rectangular cross section for simplicity and FIGS. 10-15 illustrate fin structures with a diamond-shaped cross section, the embodiments are not limited to the specific cross sections illustrated. Further, the processes and steps discussed in relation to one illustrated embodiment are applicable to the other illustrated embodiment. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
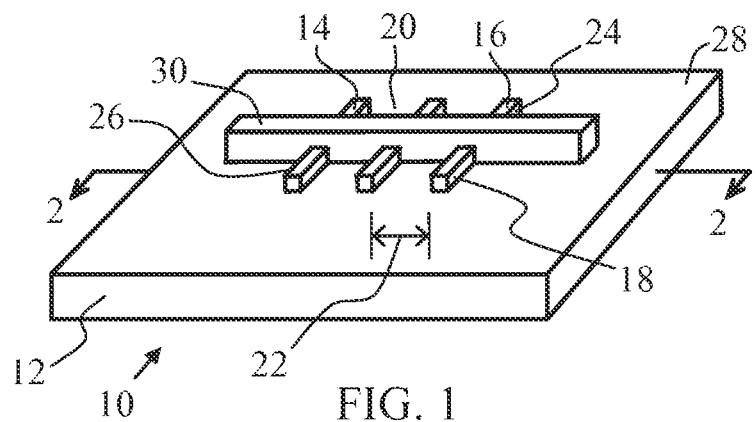
FIG. 1 illustrates, in perspective view, a portion of an integrated circuit having a non-planar multi-gate transistor in accordance with an embodiment herein.

In FIG. 1, in an exemplary embodiment, the method for fabricating an integrated circuit 10 begins by providing a semiconductor substrate 12. Structures 14, such as fins, are formed on the semiconductor substrate 12 and have top surfaces 16 and sidewalls 18. As shown, the fin structures 14 are separated by gaps 20 with a length 22. Each fin structure 14 has a source region 24 and a drain region 26 which are defined in relation to gate 30.

The fin structures 14 are formed according to known processes. For instance, when using a silicon-on-oxide semiconductor substrate 12, portions of the top silicon layer are etched or otherwise removed leaving the fin structures 14 formed from silicon remaining on the underlying oxide layer 28. As shown, gate 30 is formed across the fin structures 14. Gate oxide and/or nitride capping layers (not shown) may first be deposited over the fin structures 14. The gate 30 is formed by typical lithographic processing.

Figure 2:
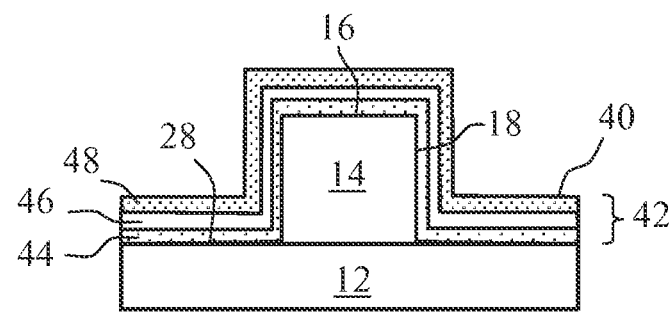
FIGS. 2-15 illustrate, in cross section, a portion of an integrated circuit and method steps for fabricating an integrated circuit in accordance with various embodiments herein.

FIGS. 2-9 are cross-sectional views of a single fin structure 14 taken along line 2-2 in FIG. 1 during further processing. In FIG. 2, a metal film stack 40 is deposited over the fin structure 14 and the oxide layer 28 of the semiconductor substrate 12. Specifically, the metal film stack 40 is conformally deposited, such as by atomic layer deposition (ALD). In an exemplary embodiment, the metal film stack 40 has a thickness 42 of no more than about four nanometers. In certain embodiments, the method includes pre-cleaning the fins with a fluorine-containing chemistry before conformally depositing the metal film stack 40.

In FIG. 2, the metal film stack 40 includes three metal layers 44, 46, and 48, though it is contemplated that the metal film stack 40 include two or more layers. To form the metal film stack 40 in FIG. 2, a first layer 44 is conformally deposited, such as by ALD, over the top surface 16 and sidewalls 18 of each fin structure 14 and over the oxide layer 28 of the semiconductor substrate 12. Then, second layer 46 is deposited over the first layer 44 by ALD, and third layer 48 is deposited over the second layer 46 by ALD.

In an exemplary embodiment, the first layer 44 includes platinum, the second layer 46 includes nickel, and the third layer 48 includes platinum. This exemplary embodiment forms NiSi with Pt in solid solution. Pt is used in solid solution to slow the formation of NiSi2, which is the thermodynamically stable phase, and must expel the Pt from the solid solution before forming. However, Ni diffuses faster than Pt so Pt is deposited first in order to get the Pt into the very thin NiPtSi material. For such an embodiment, the first layer 44 may be deposited by exposing the top surface 16 and sidewalls 18 of each fin structure 14 to a platinum precursor, such as a platinum precursor selected from Pt(PF3)4, MeCpTtMe3, CpPtMe3, and Pt(acac)2. Further, the second layer 46 may be deposited by exposing the first layer 44 to a nickel precursor, such as a nickel precursor selected from Ni(PF3)4, Ni(iPr-MeAMD)2, Ni(tBu-MeAMD)2, Bis(dimethylamimp-methyl-butoxy)Ni, Ni(MeCp)2, and bis-(2-Imino-Pen-En 4-Trifluoro-Acetylacetonato) Ni(II)-Mi(ktfaa)2. Also, the third layer 48 may be deposited by exposing the second layer 46 to a platinum precursor, such as a platinum precursor selected from Pt(PF3)4, MeCpTtMe3, CpPtMe3, and Pt(acac)2.

Figure 3:
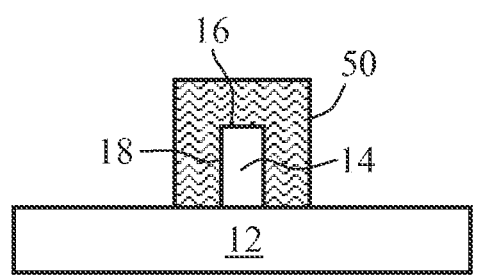

FIG. 3 shows the integrated circuit 10 after the metal film stack 40 of FIG. 2 has been annealed. During thermal annealing, the metal film stack 40 reacts with the silicon of each fin structure 14 to form a metal silicide film 50 over the top surface 16 and sidewalls 18 of each fin structure 14. The metal film stack 40 positioned over the oxide layer 28 is not in contact with silicon and does not react. After annealing, the non-reacted portions of the metal film stack 40 are removed, leaving the structure shown in FIG. 3. As shown in FIG. 3, a portion, but not all, of the fin structure 14 has been consumed during the silicide reaction. The entire fin structure 14 is not consumed during silicidation because the thickness 42 of the metal film stack 40 is no more than about four nanometers.

The metal silicide film 50 is a contact for the source and drain region 24, 26 (see FIG. 1) for each fin structure 14. As shown, the metal silicide film contact 50 is formed along both the vertical sidewalls 18 and the top surface 16 of the fin structure 14.

Figure 4:
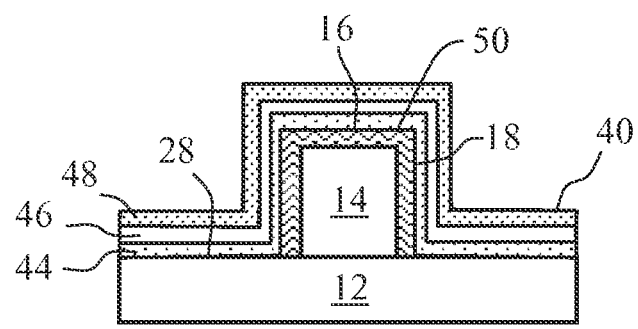

FIG. 4 illustrates another embodiment of the method for fabricating an integrated circuit 10. In FIG. 4, the structure of the integrated circuit 10 of FIG. 2 is thermally annealed at a low temperature, such as at about 300° C. or less. As a result of the low temperature anneal, a partial silicidation reaction occurs between the metal film stack 40 and the silicon of the fin structure 14 along the top surface 16 and sidewalls 18 to form a portion of a metal silicide film 50. "Partial" refers to the fact that the reaction is stopped before either all of the metal film stack 40 is consumed or all of the silicon of fin structure 14 is consumed. While FIG. 4, shows layers 44, 46 and 48 around the fin structure 14, one or both of layer 44 and 46 may be consumed during the low temperature anneal.

Figure 5:
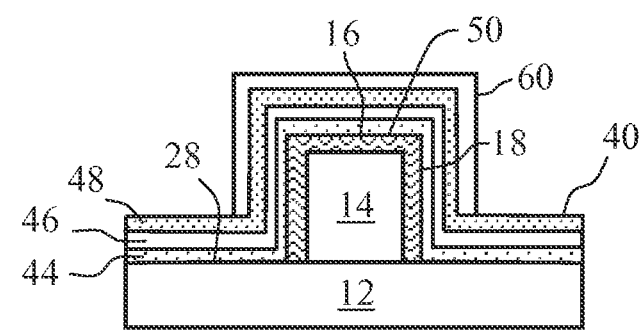
Figure 6:
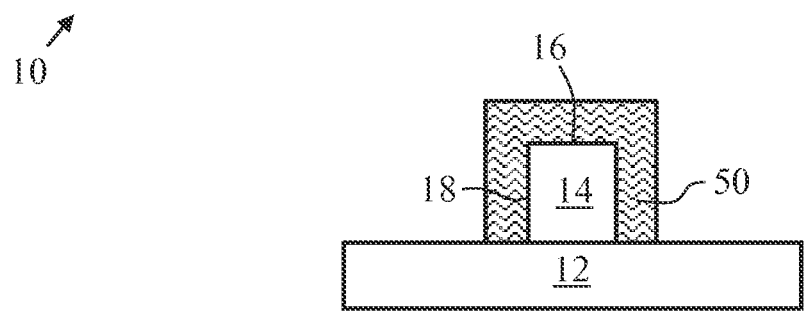

As further shown in FIG. 5, a silicon layer 60 is deposited over the metal film stack 40. Specifically, silicon layer 60 is deposited onto layer 48. Then, a second thermal anneal is performed to react the silicon layer 60 with the remaining layers 44, 46, 48. The second anneal may consume all of silicon layer 60 to form the integrated circuit 10 in FIG. 6. Cross-referencing FIG. 6 with FIG. 3, it may be seen that the additional silicon layer 60 in the method used to form the integrated circuit 10 of FIG. 6 reduces the amount of fin structure 14 that is consumed during silicidation. Similar to FIG. 3, the metal silicide film 50 of FIG. 6 is a contact for the source and drain region 24, 26 (see FIG. 1) for each fin structure 14. The metal silicide film contact 50 is formed along both the vertical sidewalls 18 and the top surface 16 of the fin structure 14.

Figure 7:
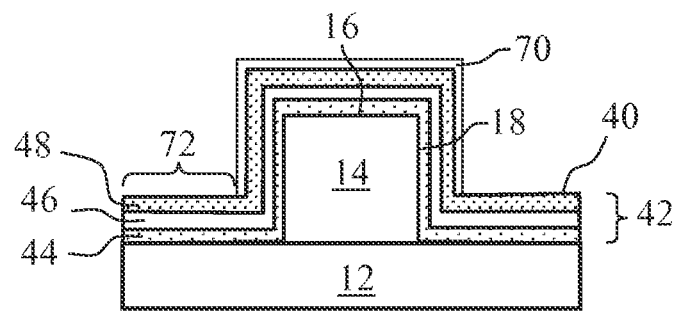

Referring now to FIG. 7, another exemplary embodiment of the method for fabricating an integrated circuit 10 is illustrated. In FIG. 7, an additional silicon layer 70 has been deposited over the metal film stack 40 of FIG. 2. Specifically, the additional silicon layer 70 has been deposited over the layer 48 surrounding the fin structure 14 by ALD by exposing the layer 48 to a silicon source such as Si2H6, Si3H8, and SiH4. Through known lithographic steps, the additional silicon layer 70 is either not deposited over the portions 72 of the metal film stack 40 overlying the semiconductor substrate 12, or it is selectively removed after deposition. In either case, the additional silicon layer 70 is present during the thermal anneal process and is consumed during the silicidation reaction. The resulting integrated circuit 10 is shown in FIG. 8.

Figure 8:
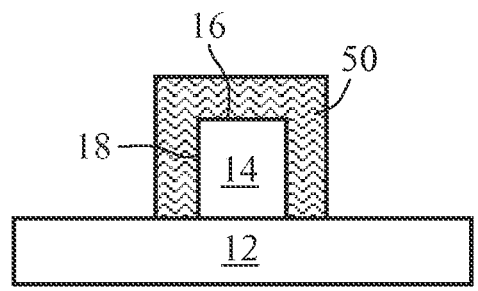

Cross-referencing the integrated circuits 10 of FIG. 8 and FIG. 3 it may be seen that the additional silicon layer 70 in the method used to form the integrated circuit 10 of FIG. 8 reduces the amount of fin structure 14 that is consumed during silicidation. Similar to FIG. 3, the metal silicide film 50 of FIG. 8 is a contact for the source and drain region 24, 26 (see FIG. 1) for each fin structure 14. The metal silicide film contact 50 is formed along both the vertical sidewalls 18 and the top surface 16 of the fin structure 14. Utilizing both the sidewalls 18 and the top surface 16 of the fin structures 14 provides a larger contact area than a merged set of fins. Therefore, contact resistance is significantly lowered as compared to that of merged fins.

Figure 9:
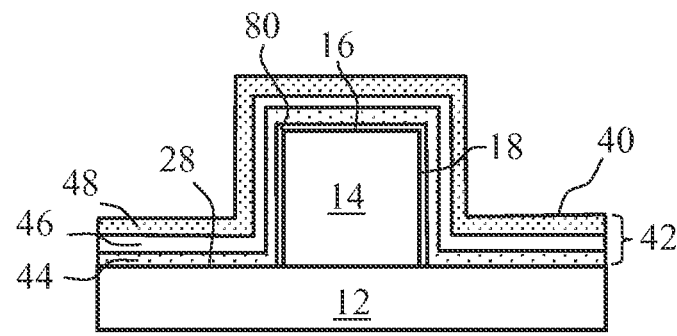

FIG. 9 illustrates another embodiment of the method for fabricating an integrated circuit 10. In FIG. 9, a silicon layer 80 is formed over the fin structure 14 of FIG. 2 before the metal film stack 40 is deposited. The silicon layer 80 may be formed with a thickness of less than about one nanometer. As shown, the silicon layer 80 is formed only on the top surface 16 and sidewalls 18 of the fin structure 14, and not along the semiconductor substrate 12 between fin structures 14. In certain embodiments, the silicon layer 80 is selectively epitaxially grown on the top surface 16 and sidewalls 18 of each silicon fin structure 14. Alternatively, the silicon layer 80 may be formed by conformally depositing silicon on the top surface 16 and sidewalls 18 of each fin structure 14. Conformal deposition may be performed by exposing the top surface 16 and sidewalls 18 of each fin structure 14 to a silicon source, such as $Si_2H_6$, $Si_3H_8$, and $SiH_4$, during an ALD process.

After the silicon layer 80 is formed, the metal film stack 40 is conformally deposited onto the silicon layer 80. Specifically, the metal layer 44 is conformally deposited directly onto the silicon layer 80 through an ALD process. Layers 46 and 48 are then deposited in accordance with the process described in relation to FIG. 2. The thermal anneal is then performed, with the silicon layer 80 and, possibly, a portion of the silicon fin structure 14 being consumed by the silicidation reaction to form the metal silicide film 50. As a result, the integrated circuit 10 of FIG. 8 is formed.

Figure 10:
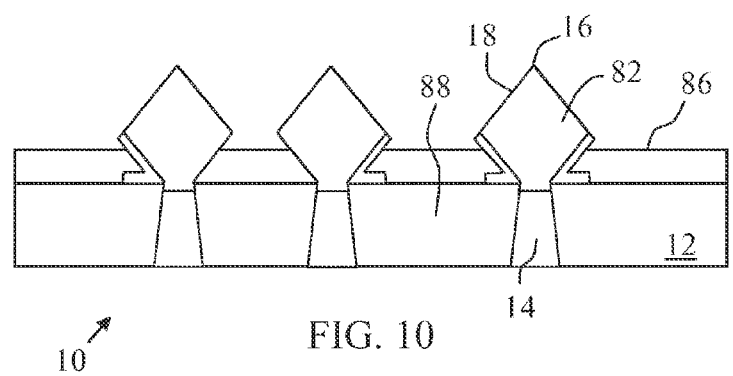
Figure 11:
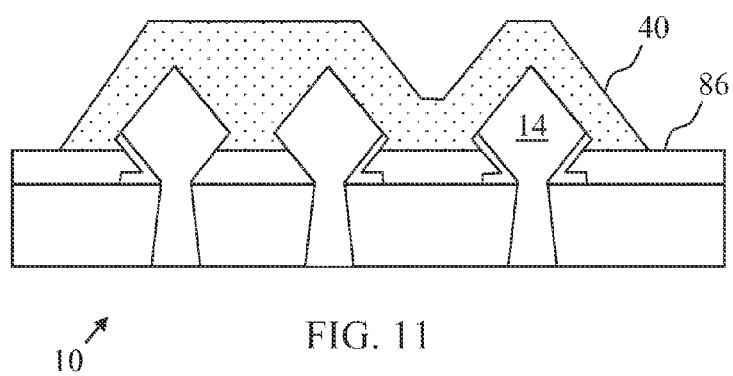
Figure 12:
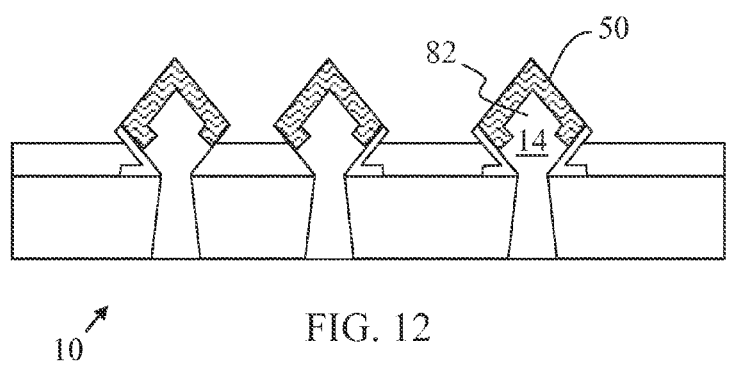

Referring now to FIGS. 10-12, an exemplary embodiment in which the fin structures 14 are formed with a diamond-shaped cross section is illustrated. In FIG. 10, the diamond-shaped fin structures 14 are formed by growing epitaxial material 82, such as silicon phosphorus SiP (for N-type) or silicon germanium SiGe (for P-type) over the existing fin structure 14. The sidewalls 18 of the diamond-shaped fin structures 14 meet at a substantially linear or edge-like top surface 16. A dielectric material 86 may be formed around lower portions of the sidewalls 18 of the fin structures 14, and an isolation region such as a shallow trench isolation (STI) 88 may be formed in the semiconductor substrate 12.

In FIG. 11, the metal film stack 40, which may include two or more layers as described above, is deposited over the fin structures 14 and dielectric material 86. Then, the integrated circuit 10 is thermally annealed to form the metal silicide film 50 on the epitaxial material 82 of the fin structures 14, as shown in FIG. 12.

Figure 13:
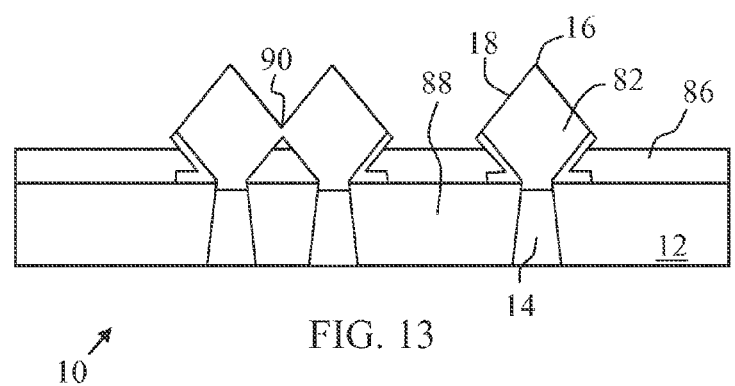
Figure 14:
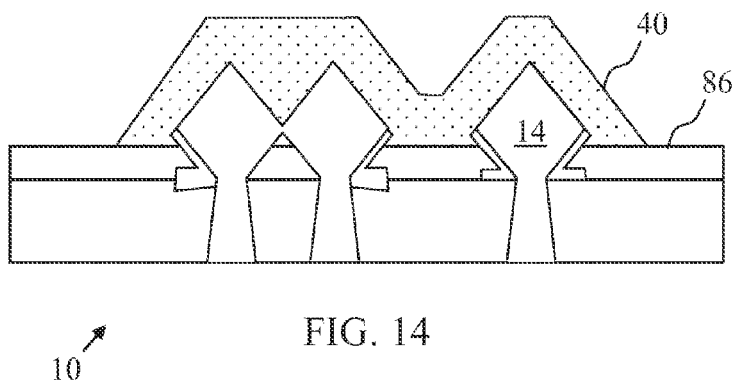
Figure 15:
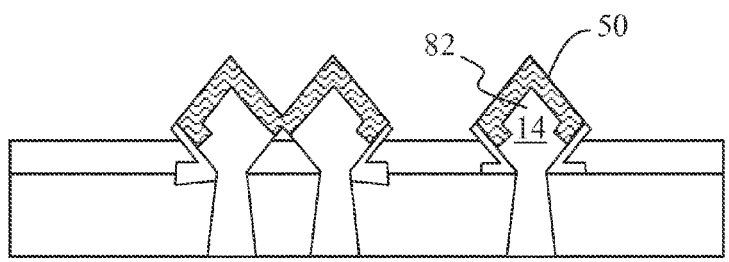

While embodiments have been described for use with unmerged fins, it is contemplated that silicide contacts may be formed on merged fins as well. FIGS. 13-15 illustrate another embodiment in which the fin structures 14 are formed with a diamond-shaped cross section. In FIG. 13, the diamond-shaped fin structures 14 are formed by growing epitaxial material 82, such as silicon phosphorus SiP (for N-type) or silicon germanium SiGe (for P-type) over the existing fin structure 14. The sidewalls 18 of the diamond-shaped fin structures 14 meet at a substantially linear or edge-like top surface 16. In FIG. 13, two adjacent diamond-shaped structures 14 are merged together at 90 as a result of growing a sufficient amount of a common epitaxial material 82 to span the gap therebetween. Again, a dielectric material 86 may be formed around the fin structures 14, and an isolation region, such as a shallow trench isolation (STI) 88 may be formed in the semiconductor substrate 12. In FIG. 14, the metal film stack 40, which may include two or more layers as described above, is deposited over the fin structures 14 and dielectric material 86. Then, the integrated circuit 10 is thermally annealed to form the metal silicide film 50 on the epitaxial material 82 of the fin structures 14, as shown in FIG. 15.

It is noted that the various embodiments for the inclusion of additional silicon to offset the amount of fin structure consumed during silicidation may be combined to form additional silicon layers both under layer 40 and over layer 48, and/or with the embodiment of performing a two-step anneal process with an initial low temperature anneal. Further, any cross sectional shape of the fin structures may be used with each process described above. After silicide film/contact formation, further typical processing may be performed, such as the connection of the contacts formed by metal silicide film 50 to the metal interconnect structure of the integrated circuit 10.

The integrated circuits and fabrication methods described herein result in improved contact formation on source and drain regions of non-planar structures, such as fins in finFETs. The fabrication methods avoid the complete consumption of the fin structure silicon by conformally depositing thin layers of silicide-forming metals along the sidewalls of the non-planar structures and/or by providing additional amounts of silicon for the silicidation process. In either case, the fin structures may remain unmerged if desired and contacts may be formed along the sidewalls of the fin structures.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
   providing a semiconductor substrate;
   forming fins over the semiconductor substrate, wherein each fin is formed from semiconductor material, and wherein the semiconductor material of each fin has sidewalls;
   forming a silicon layer on the sidewalls of each fin;
   conformally depositing a metal film on the sidewalls of the semiconductor material of each fin; and
   annealing the metal film to form a metal silicide film on the sidewalls of the semiconductor material of each fin, wherein formation of the metal silicide film consumes all of the silicon layer.

2. The method of claim 1 wherein forming fins comprises defining a gap between adjacent fins, and wherein conformally depositing a metal film stack does not fill the gap.

3. The method of claim 1 further comprising pre-cleaning the fins with a fluorine-containing chemistry before conformally depositing the metal film stack.

4. The method of claim 1 further comprising stripping non-reacted portions of the metal film stack after annealing.

5. The method of claim 1 wherein forming the silicon layer over the sidewalls of each fin comprises forming the silicon layer over the sidewalls of each fin before conformally depositing a metal film stack over the sidewalls of each fin.

6. The method of claim 5 wherein forming the silicon layer over the sidewalls of each fin comprises selectively growing epitaxial silicon on the sidewalls of each fin before conformally depositing the metal film stack, wherein the metal film stack is conformally deposited directly onto the silicon layer.

7. The method of claim 5 wherein forming the silicon layer over the sidewalls of each fin comprises depositing silicon on the sidewalls of each fin before conformally depositing the metal film stack, wherein the metal film stack is conformally deposited directly onto the silicon layer.

8. The method of claim 5 wherein forming the silicon layer over the sidewalls of each fin comprises exposing the sidewalls of each fin to a silicon source selected from $Si_2H_6$, $Si_3H_8$, and $SiH_4$.

9. The method of claim 1 wherein forming a silicon layer over the sidewalls of each fin comprises forming a silicon layer having a thickness of less than about 1 nm.

10. A method for fabricating an integrated circuit comprising:
providing a semiconductor substrate;
forming fins over the semiconductor substrate, wherein each fin has sidewalls;
conformally depositing a metal film stack over the sidewalls of each fin by conformally depositing at least two layers of metal over the sidewalls of each fin; and
annealing the metal film stack to form a metal silicide film over the sidewalls of each fin.

11. The method 10 wherein conformally depositing a metal film stack over the sidewalls of each fin comprises depositing at least two layers of metal by atomic layer deposition (ALD).

12. The method of claim 11 wherein conformally depositing a metal film stack over the sidewalls of each fin comprises:
depositing a first layer of platinum over the sidewalls of each fin by ALD; and
depositing a layer of nickel over the first layer of platinum by ALD.

13. The method of claim 12 wherein conformally depositing a metal film stack over the sidewalls of each fin further comprises depositing a second layer of platinum over the layer of nickel by ALD.

14. The method of claim 12 wherein depositing the first layer of platinum over the sidewalls of each fin by ALD comprises exposing the sidewalls of each fin to a platinum precursor selected from $Pt(PF_3)_4$, MeCpTtMe3, CpPtMe3, $Pt(acac)_2$, and wherein depositing the layer of nickel over the first layer of platinum by ALD comprises exposing the first layer of platinum to a nickel precursor selected from $Ni(PF_3)_4$, Ni(iPr-MeAMD)2, Ni(tBu-MeAMD)2, Bis(dimethylamimp-methyl-butoxy)Ni, Ni(MeCp)2, and bis-(2-Imino-Pen-En 4-Trifluoro-Acetylacetonato) Ni(II)-Mi(ktfaa)2.

15. A method for fabricating an integrated circuit comprising:
forming a non-planar structure of semiconductor material having a bottom surface over an upper surface of an insulator layer, wherein the non-planar structure of semiconductor material includes sidewalls;
depositing a metal silicide material over sidewalls of the non-planar structure and on the insulator layer; and
annealing the metal silicide material to form a metal silicide film from the metal silicide material and from the sidewalls of the non-planar structure, wherein the metal silicide film contacts the insulator layer.

16. The method of claim 15 further comprising forming a silicon layer over the sidewalls of the non-planar structure, wherein annealing the metal silicide material comprises consuming all of the silicon layer.

17. The method of claim 15 wherein depositing the metal silicide material comprises depositing at least two layers of metal over the sidewalls of the non-planar structure.

* * * * *